US006259793B1

(12) United States Patent
Washio et al.

(10) Patent No.: US 6,259,793 B1
(45) Date of Patent: Jul. 10, 2001

(54) SOUND REPRODUCTION METHOD, SOUND REPRODUCTION APPARATUS, SOUND DATA CREATION METHOD, AND SOUND DATA CREATION APPARATUS

(75) Inventors: Nobuyuki Washio; Yasushi Yamazaki, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/030,165

(22) Filed: Feb. 25, 1998

(30) Foreign Application Priority Data

Apr. 28, 1997 (JP) .................................................. 9-111559

(51) Int. Cl.$^7$ ................................ H04B 1/00; H03G 3/00

(52) U.S. Cl. ............................ 381/119; 381/63; 381/109; 369/3

(58) Field of Search .................................. 381/56, 58, 61, 381/63, 102, 104, 106, 107, 108, 109, 110, 120; 84/630, DIG. 26; 369/3, 1

(56) References Cited

U.S. PATENT DOCUMENTS

| | | | | |
|---|---|---|---|---|
| 4,434,325 | * | 2/1984 | Kobayashi et al. | 381/105 |
| 4,616,271 | * | 10/1986 | Yasukawa et al. | 381/107 |
| 4,993,073 | * | 2/1991 | Sparkes | 381/119 |
| 5,054,077 | * | 10/1991 | Suzuki | 381/119 |
| 5,177,801 | * | 1/1993 | Shoda et al. | 381/119 |
| 5,315,662 | * | 5/1994 | Hayashi et al. | 381/118 |
| 5,377,167 | * | 12/1994 | Maeda et al. | 369/47 |
| 5,483,293 | * | 1/1996 | Okuhara | 455/219 |
| 5,623,551 | * | 4/1997 | East et al. | 381/119 |
| 5,930,375 | * | 7/1999 | East et al. | 381/119 |
| 6,031,916 | * | 2/2000 | Saito et al. | 381/61 |

FOREIGN PATENT DOCUMENTS

| | | | | |
|---|---|---|---|---|
| 10-70958 | * | 3/1989 | (JP) | G11B/20/04 |

* cited by examiner

*Primary Examiner*—Xu Mei
(74) *Attorney, Agent, or Firm*—Staas & Halsey LLP

(57) ABSTRACT

An apparatus for continuously reproducing plural sound data has a start end/terminal end determination unit for determining the start end/terminal end of the continued respective sound data, a fade-in/fade-out unit for carrying out fade-in process at the start end of plural respective sound data and/or fade-out process at the terminal end of the same, a data output unit for continuously outputting the plural sound data which have been subjected to fade-in process and/or fade-out process, and a reproduction unit for reproducing the outputted plural sound data. In reproducing continuously the plural sound data, no noise is generated at the joint portion of the adjacent sound data.

3 Claims, 16 Drawing Sheets

FIG. 6A NON-SUPERIMPOSITION (BOTH ENDS)
VOLUME
DATA
TIME
FIG. 6B SUPERIMPOSITION (BOTH ENDS)
VOLUME
DATA
TIME
FIG. 6C NON-SUPERIMPOSITION (TERMINAL END)
VOLUME
DATA
TIME
FIG. 6D NON-SUPERIMPOSITION (START END)
VOLUME
DATA
TIME
FIG. 6E SUPERIMPOSITION (TERMINAL END)
VOLUME
DATA
TIME
FIG. 6F SUPERIMPOSITION (START END)
VOLUME
DATA
TIME

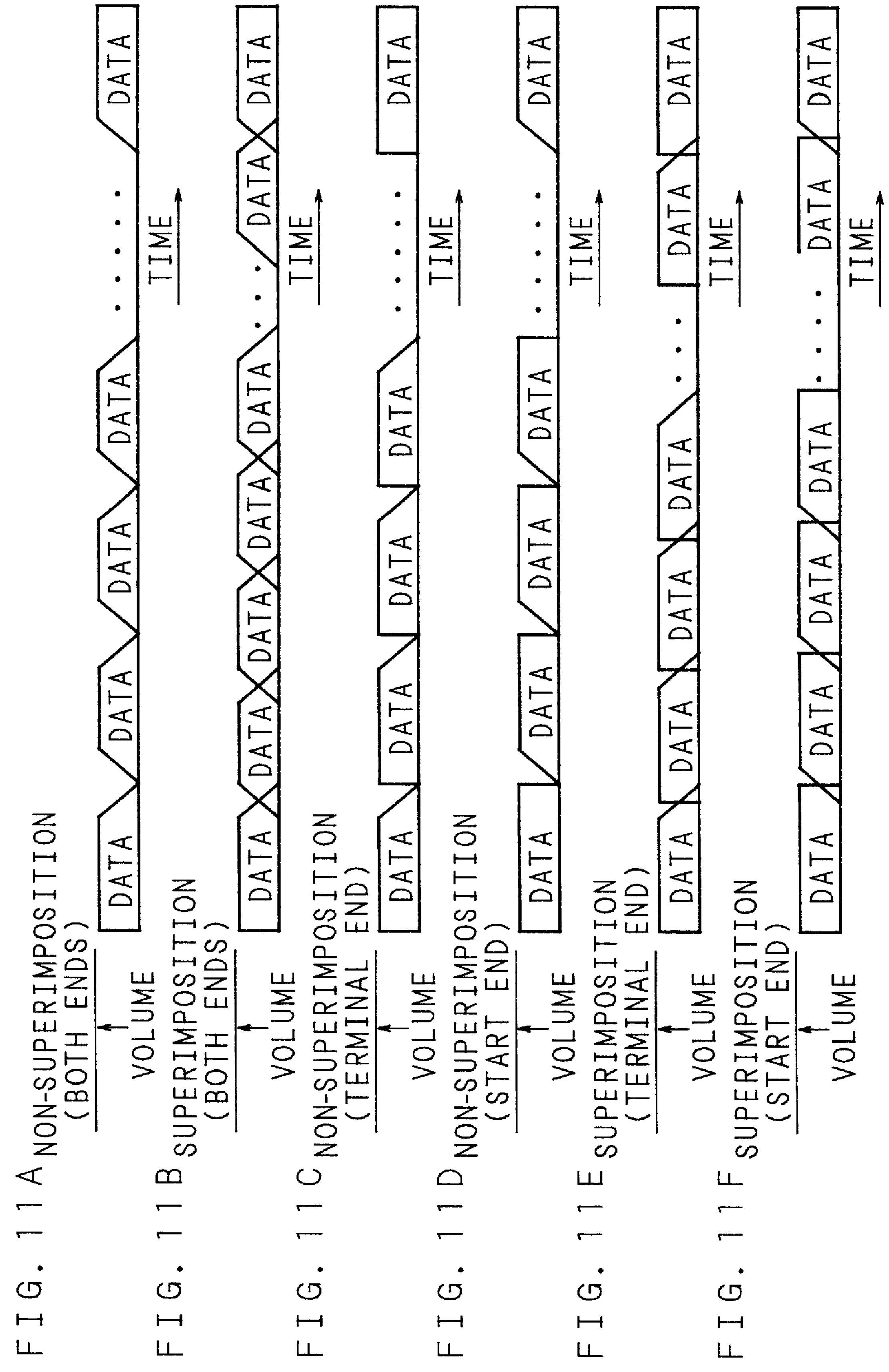
FIG. 11A NON-SUPERIMPOSITION (BOTH ENDS)
FIG. 11B SUPERIMPOSITION (BOTH ENDS)
FIG. 11C NON-SUPERIMPOSITION (TERMINAL END)
FIG. 11D NON-SUPERIMPOSITION (START END)
FIG. 11E SUPERIMPOSITION (TERMINAL END)
FIG. 11F SUPERIMPOSITION (START END)
VOLUME
DATA
TIME

ORIGINAL DATA

DATA AFTER FILTER PROCESS

DATA AFTER FADE-IN/FADE-OUT PROCESS

SOUND REPRODUCTION METHOD, SOUND REPRODUCTION APPARATUS, SOUND DATA CREATION METHOD, AND SOUND DATA CREATION APPARATUS

BACKGROUND OF THE INVENTION

1. Field of the Invention

The present invention relates to a method and an apparatus for continuously reproducing plural sound data, and a method and an apparatus for creating plural sound data for the purpose of continuous reproduction. More particularly, the invention relates to an improved sound reproduction technique for continuously reproducing realistic environmental sound such as sound of hustle and bustle, chirping of small birds, background music or the like, with as small sound source data as possible.

2. Description of the Prior Art

In various amusement apparatuses and facilities, environmental sound is indispensable for producing atmosphere. There is a technique that, in reproducing such environmental sound for a predetermined duration, in order to minimize the amount of data forming the sound source, short sound data are repeatedly read out to give an impression that continuous sounds were reproduced.

FIG. 1 is a block diagram showing a conventional system constitution for continuously reproducing the plural sound data. The system is provided with a reproduction process unit 51, a terminal end determination unit 52, a data output unit 53, and a reproduction unit 54. In the case of continuous reproduction of continued sound data, the reproduction process unit 51 repeats the process of reading the sound data to be reproduced, and writing said sound data to the data output unit 53. Further, the sound data written to if the data output unit 53 are outputted to the reproduction unit 54 such as a speaker. In such sequential processes, the position of the sound data read by the reproduction process unit 51 in the whole data is monitored by the terminal end determination unit 52. When the position reaches the terminal end of certain sound data, a terminal end signal is sent from the terminal end determination unit 52 to the reproduction process unit 51 and reading and writing of the next sound data are carried out. In this manner, the plural sound data are continuously reproduced. FIG. 2 is a conceptual view showing the reproduction condition of the continuous sound data in the conventional case.

The continuous sound data may be the sound data of the same kind or the sound data of different kinds. In the case of the sound data of the same kind, reading and writing are performed on the same sound data and the same sound data are to be repeatedly reproduced.

In the conventional system as described above, the system simply reads the beginning end of the next sound data after reading the terminal end of the previous sound data in reproducing plural sound data continuously. Accordingly, there may be cases in which discontinuity occurs at the juncture between the terminal end of the previous sound data and the beginning end of the next sound data. Thus, a noise like a click sound can be generated, thereby giving discomfort to the listeners.

BRIEF SUMMARY OF THE INVENTION

An object of the present invention is to provide a sound reproduction method and a sound reproduction apparatus wherein, in reproducing plural sound data continuously, no noise is formed at the joint between the adjacent sound data.

Another object of the present invention is to provide a sound data reproduction method and a sound data reproduction apparatus in which it is possible to create a plurality of continued sound data which do not generate noise at the joint at the time of reproduction.

According to the sound reproduction apparatus of the invention, fade-in process or fade-out process is carried out at the start end and/or the terminal end of continued respective sound data. Accordingly, generation of noise at the joint of the adjacent sound data can be prevented, and no unpleasant feeling is given to the listeners.

According to the sound data creation apparatus of the invention, the processed sound data subjected to fade-in process or fade-out process at the start end and/or the terminal end of the continued respective sound data are created and retained. Accordingly, using the processed sound data thus created, the sound having no noise at the joint of the adjacent sound data can be offered to the listeners for repeated times.

The above and further objects and features of the invention will more fully be apparent from the following detailed description with accompanying drawings.

BRIEF DESCRIPTION OF THE SEVERAL VIEWS OF THE DRAWINGS

FIGS. 11A–11F are conceptual views showing the continued sound data reproduction condition;

DETAILED DESCRIPTION OF THE INVENTION

First, the principle of the present invention is explained.

Figure 1:
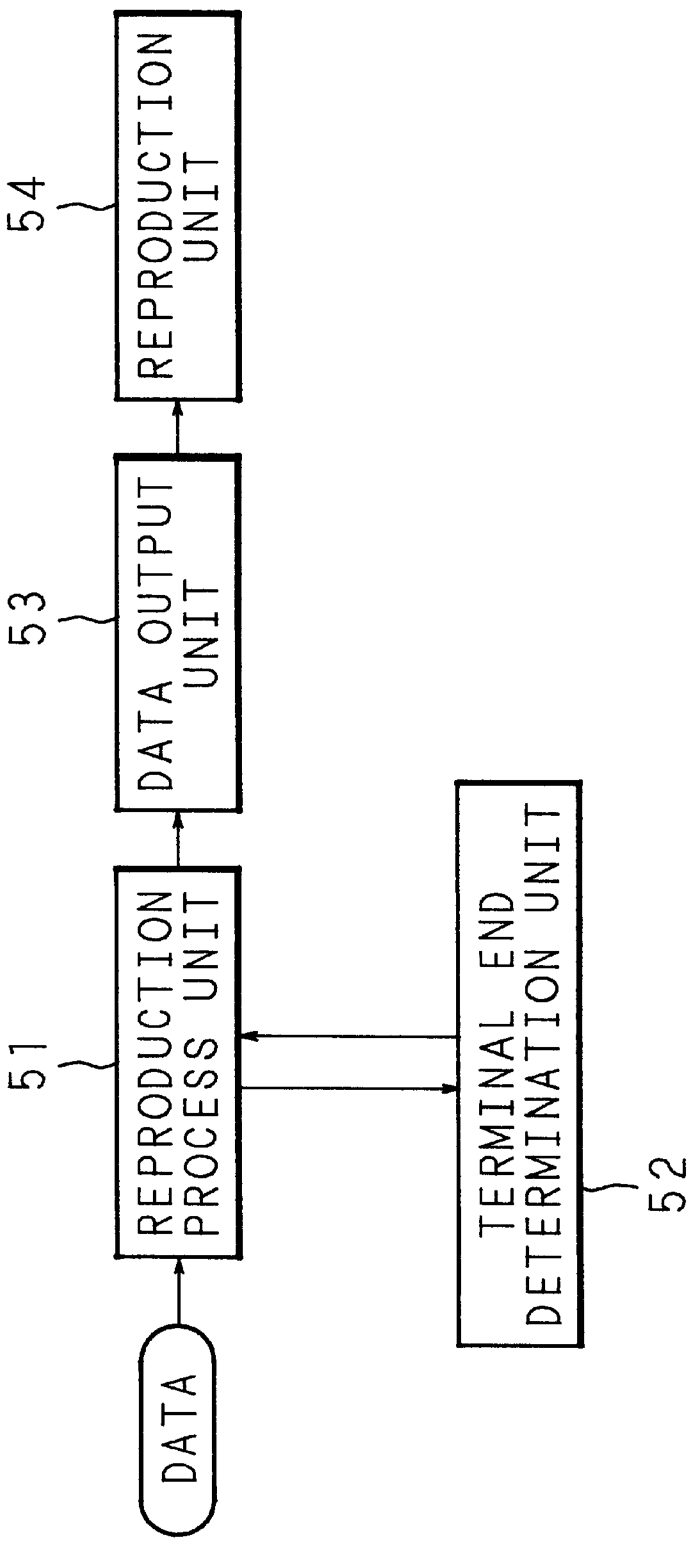
FIG. 1 PRIOR ART
FIG. 1 is a block diagram showing the constitution of a conventional sound reproduction apparatus.
Figure 2:
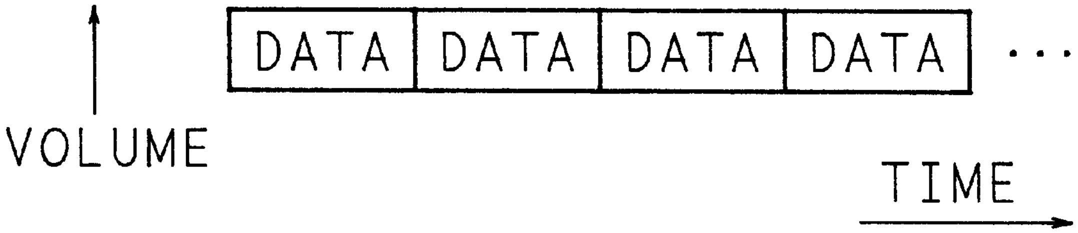
FIG. 2 PRIOR ART
FIG. 2 is a conceptual view showing the conventional continued sound data reproduction condition.
Figure 3:
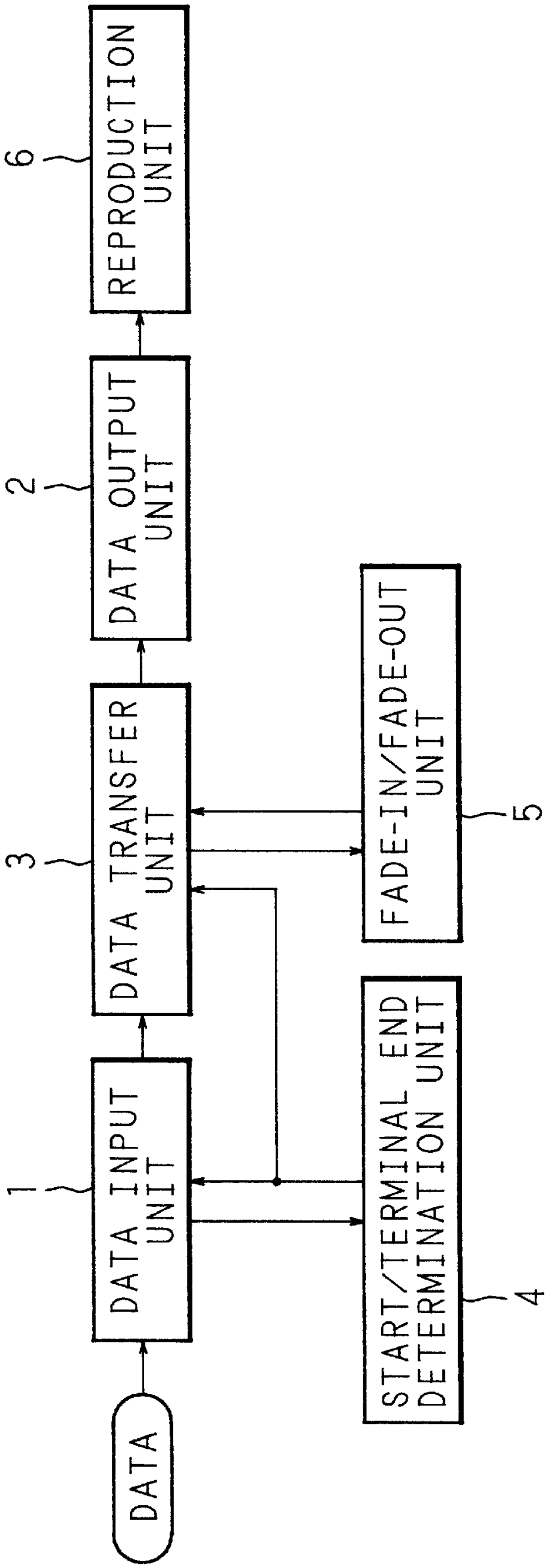
FIG. 3 is a principle constitution view of the sound reproduction apparatus of the invention.

FIG. 3 is a principle constitution view of the sound reproduction apparatus of the invention. The sound reproduction apparatus comprises a data input unit 1 for reading the original sound data, a data output unit 2 for outputting the sound data for reproduction. A data transfer unit 3 is for transferring the sound data read into the data input unit 1 as they are, or the data subjected to the fade-in process at the start end and/or the fade-out process at the terminal end to the data output unit 2. A start/terminal end determination unit 4 is for determining whether the part read by the data input unit 1 is the start end or the terminal end of the sound data and outputting the start/terminal end determination signal to the data input unit 1 and the data transfer unit 3. A fade-in/fade-out unit 5 is for carrying out a fade-in process at the start end of the sound data from the data input unit 1 and carrying out a fade-out process at the terminal end and sending the sound data after processing to the data transfer unit 3. Further, a reproduction unit 6 is for reproducing the sound data.

The sound data to be reproduced are continuously read into the data input unit 1 and sent to the data transfer unit 3. The start/terminal end determination unit 4 monitors the start end/terminal end of each sound data thus read, and transmits a start/terminal end determination signal to the data input unit 1 and the data transfer unit 3. This signal is sent between the point when the terminal end of the sound data is sent from the data input unit 1 to the date transfer unit 3 and the point when the start end of the sound data is sent from the data input unit 1 to the data transfer unit 3. When this start/terminal end determination signal is inputted, the data transfer unit 3 does not transfer the sound data sent from the data input unit 1 as they are to the data output unit 2, but sends the sound data to the fade-in/fade-out unit 5. The fade-in/fade-out unit 5 carries out the fade-in process at the start end of the inputted sound data and/or the fade-out process at the terminal end thereof, and returns the sound data after processing to the data transfer unit 3. Further, the sound data subjected to the fade-in process at the start end and/or the fade-out process at the terminal end is sent from the data transfer unit 3 to the data output unit 2. The sound data in the part other than the start end and/or the terminal end is sent to the data output unit 2 through the data transfer unit 3 in the state of being read into the data input unit 1.

In the invention, the continued plural sound data are subjected to a fade-in process or a fade-out process at the start end and/or the terminal end of the respective sound data. Accordingly, it is possible to prevent generation of noise like a click sound at the joint of the adjacent sound data.

In another sound reproduction apparatus of the invention, sound data formed by superimposing the parts of the adjacent sound data are sent to the data output unit 2. For example, the fade-out processed terminal end of the preceding sound data is superimposed with the fade-in processed start end of the succeeding sound data. By carrying out such superimposing of sound data, the spot where the intensity of the sound data becomes zero due to the fade-in process/fade-out process is eliminated. Thus an impression of discontinuity of sound is eliminated in reproduction.

In a further sound reproduction apparatus of the invention, it is recognized that the start end-of the foremost sound data and the terminal end of the last sound data in the plural continued sound data do not constitute joints of the sound data. Because of this fact, such a start end and terminal end are not subjected to fade-in or fade-out process, but are allowed to retain the tone and feature of the original sound data.

There may be cases in which an echo or 3D sound process is carried out on the original sound data and a reverberation component is added to obtain new sound data. With respect to the continued sound data obtained in this manner, the reverberation component in each sound data is subjected to a fade-out process, and the start end of each sound data is subjected to a fade-in process for the same length as that of the reverberation component. A sound data obtained by superimposing the reverberation component subjected to the fade-out process in the preceding sound data and the start end subjected to the fade-in process in the succeeding sound data is sent to the data output unit 2. Consequently, with the effect of the echo and 3D sound retained, the length of the sound data after superimposing becomes the same as that of the sound data before the echo and 3D sound processing.

Figure 4:
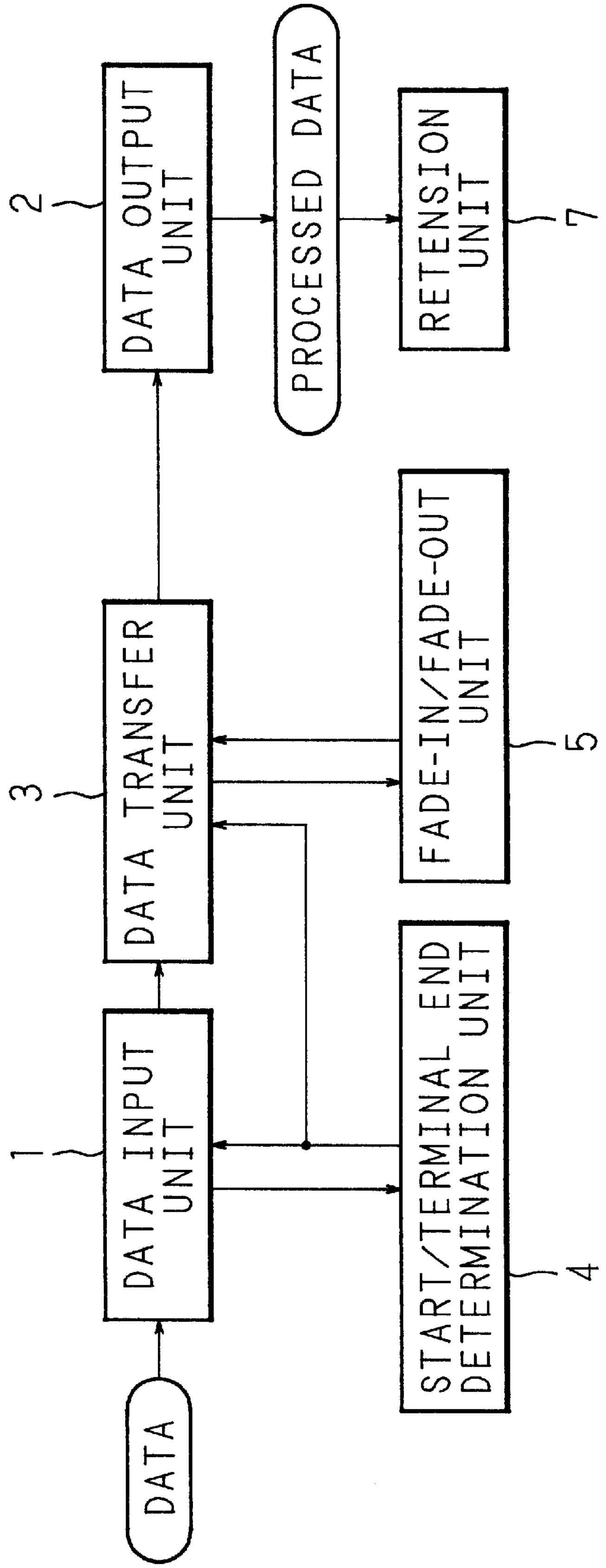
FIG. 4 is a principle constitution view of the sound data creation apparatus of the invention.

FIG. 4 is a principle constitution view of the sound data creation apparatus of the invention. In this view the sound data creation apparatus comprises a data input unit 1, a data output unit 2, a data transfer unit 3, a start/terminal end determination unit 4, and a fade-in/fade-out unit 5, which are the same as those of the sound reproduction apparatus shown in FIG. 3. The apparatus of FIG. 4 also comprises a retention unit 7 for retaining the processed sound data outputted from the output unit 2. The basic operations of these data input unit 1, data output unit 2, data transfer unit 3, start/terminal end determination unit 4, and fade-in/fade-out unit 5 are the same as those of the case of the sound reproduction apparatus of FIG. 3. However, in FIG. 4 sound data subjected to a fade-in process and/or a fade-out process at the start end and/or the terminal end thereof, outputted from the data output unit 2, are retained in the retention unit 7.

When the sound data subjected to the fade-in process and/or the fade-out process at the start end and/or the terminal end thereof are created and retained, in the case of reproducing the plural continued sound data in the same pattern, the created sound data may be used to eliminate the necessity to repeat the fade-in/fade-out process again, so that the amount of processing in reproduction can be curtailed. Moreover, once the sound data after the fade-in/fade-out process is retained, no noise occurs at the joint of the sound data even in the case of using the conventional reproduction apparatus.

The present invention is applicable to the case of the continuation of the same kind of sound data, i.e., the case of repeatedly reproducing the same sound data many times, and also to the case of the continuation of the different kinds of sound data.

The embodiments of the invention are concretely explained below.

(First embodiment)

Figure 5:
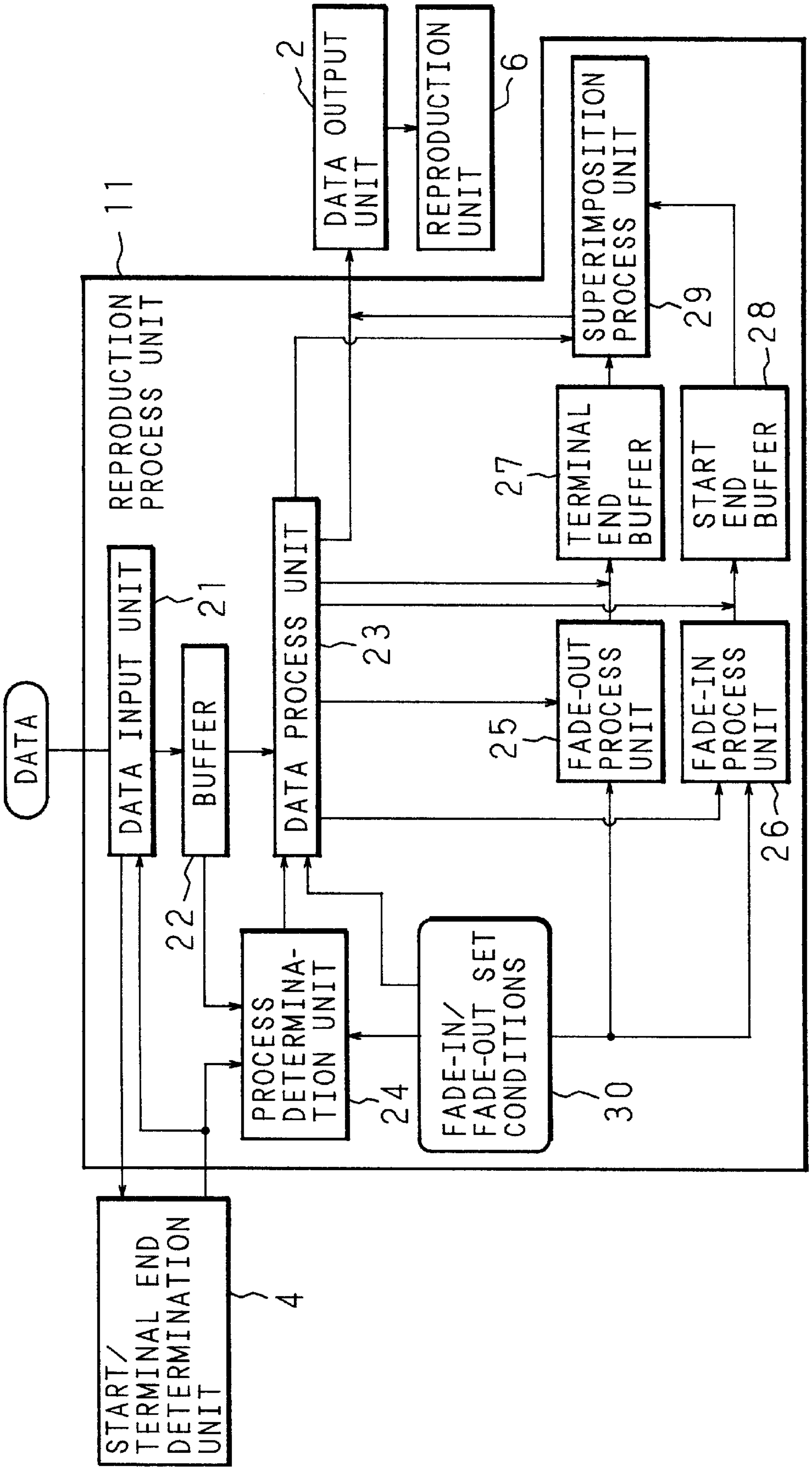
FIG. 5 is a block diagram showing the constitution of the first and third embodiments (sound reproduction apparatus)

FIG. 5 is a block diagram showing the constitution of the first embodiment (sound reproduction apparatus) of the invention. The sound reproduction apparatus of the first embodiment comprises a reproduction process unit 11, a start/terminal end determination unit 4, a data output unit 2, and a reproduction unit 6. The reproduction process unit 11 comprises a data and input unit 21 for reading the sound data, a buffer 22 for temporarily storing the read sound data. A data process unit 23 controls reading of the sound data to the data output unit 2, fade-in/fade-out process to the sound data, superimposition process of the adjacent sound data, etc. A process determination unit 24 monitors the length of the sound data retained in the buffer 22 and sends various command signals to the data process unit 23 based on the data length and the start/terminal end determination signal from the start/terminal end determination unit 12. A fade-out process unit 25 is for carrying out fade-out a process at the terminal end of the sound data according to the preset fade-in/fade-out set conditions 30. A fade-in process unit 26 carries out a fade-in process at the start end of the sound data according to the fade-in/fade-out set conditions 30. A terminal end buffer 27 is for temporarily storing the terminal end of the fade out processed sound data and a start end buffer 28 is for temporarily storing the start end of the fade-in processed sound data. A superimposition process unit 29 is for superimposing the outputs of the terminal end buffer 27 and the start end buffer 28 to obtain the superimposed part of the sound data.

Next, the operation is explained. Whether to carry out a fade-in process at the start end of the sound data or to carry out a fade-out process at the terminal end of the sound data can be optionally set. Further, whether to superimpose the start end and the terminal end among the adjacent sound data may be freely set. Such set conditions indicate whether or not the fade-in process/fade-out process is carried out and whether or not the superimposition of the start/terminal end is carried out are incorporated in the fade-in/fade-out set conditions 30. The fade-in/fade-out set conditions 30 include the length of the sound data at the start/terminal end to be the subject of fade-in/fade-out process (width of fade-in/fade-out), process patterns of fade-in/fade-out, the data length of the superimposition part at the start/terminal ends, and the like.

The sound data read by the data input unit 21 is temporarily retained in the buffer 22. The start/terminal end determination unit 4 monitors the start end/terminal end of each sound data read into the data input unit 21. The unit 24 transmits the start/terminal end determination signal to the data input unit 21 and the process determination unit 24 between the point at which the terminal end of the sound data is written into the buffer 22 from the data input unit 21 and the point at which the start end of the next sound data is written into the buffer 22 from the data input unit 21. This start/terminal end determination signal is also issued at the start and the termination of the continuous reproduction of sound data. By the input timing of this start/terminal end determination signal, reading of the next sound data in the data input unit 21 is started.

The process determination unit 24 issues a command signal to the data process unit 23 so as to transfer the sound data having a length of α to the data output unit 2 at the point of the retention of the sound data having the length of the fade-in/fade-out width+α (α is a predetermined value) in the predetermined fade-in/fade-out set conditions 30. And, according to this command signal, the sound data having a length of a is read out from the top of the data in the buffer 22 and outputted to the data output unit 2 through the data process unit 23. This process is a normal process in which neither the fade-in process nor fade-out process is applied.

On receipt of the start/terminal end determination signal from the start/terminal end determination unit 4, the process determination unit 24 issues a command signal to the data process unit 23 so as to transfer the sound data which is in excess of the fade-in/fade-out widths to the data output unit 2 in the sound data retained in the buffer 22 at that time. And, according to the command signal, the data process unit 23 carries out processing.

Next, in the case where a fade-out process is carried out at the terminal end of the sound data, the process determination unit 24 issues a command signal to the data process unit 23 to carry out fade-out process on the sound data at the terminal end of the predetermined width portion. And, according to this command signal, the data process unit 23 transfers the sound data to be processed from the buffer 22 to the fade-out process unit 25, along with the process command. The fade-out process unit 25 carries out fade-out process at the terminal end of the sound data, and stores the sound data after processing to the terminal end buffer 27. On the other hand, in the case where the terminal end of the sound data is not subjected to fade-out process, the process determination unit 24 issues a command signal to the data process unit 23 so as to transfer the sound data at the terminal end of the predetermined width portion to the terminal end buffer 27. And, according to this command signal, the sound data is stored in the terminal end buffer 27 from the buffer 22.

Also, in the case where a start end of the sound data is subjected to a fade-in process, the process determination unit 24 waits until the sound data for the predetermined width portion from the top part of the input sound data is retained in the buffer 22, and at the point when the portion has been retained, issues a command signal to the data process unit 23 to carry out fade-in process on the sound data at the start end for the predetermined width portion. And, according to this command signal, the data process unit 23 transfers the sound data to be processed from the buffer 22 to the fade-in process unit 26 along with the process command. The fade-in process unit 26 carries out fade-in process at the start end of the sound data, and retains the sound data after the process in the start end buffer 28. On the other hand, in the case where the start end of the sound data is not subjected to fade-in process, the process determination unit 24 issues a command signal to the data process unit 23 so as to transfer the sound data at the start end of the predetermined width portion to the start end buffer 28. And, according to this command signal, the sound data is stored in the start end buffer 28 from the buffer 22.

Next, in the case where the start end and the terminal end of the adjacent sound data are superimposed, the data process unit 23 issues a command to the superimposition process unit 29 to superimpose the sound data in the terminal end buffer 27 and the sound data in the start end buffer 28. According to this command, superimposition process of the start end and the terminal end of the adjacent sound data corresponding to the set conditions is performed, and the superimposition sound data after processing is outputted from the superimposition process unit 29 to the data output unit 2. On the contrary, in the case where the start end and the terminal end of the adjacent sound data are not superimposed, the data process unit 23 issues a command to the superimposition process unit 29 so as to read the sound data in the terminal end buffer 27 and the sound data in the start end buffer 28 in this order without superimposition. According to this command, the sound data in the terminal end buffer 27 and the sound data in the start end buffer 28 are outputted sequentially to the data output unit 2.

The process operations as described above are those in the course of the continuous reproduction. At the start and the end of the continuous reproduction, only the start end side process or the terminal end side process of the process operations described above is performed.

Figure 6:
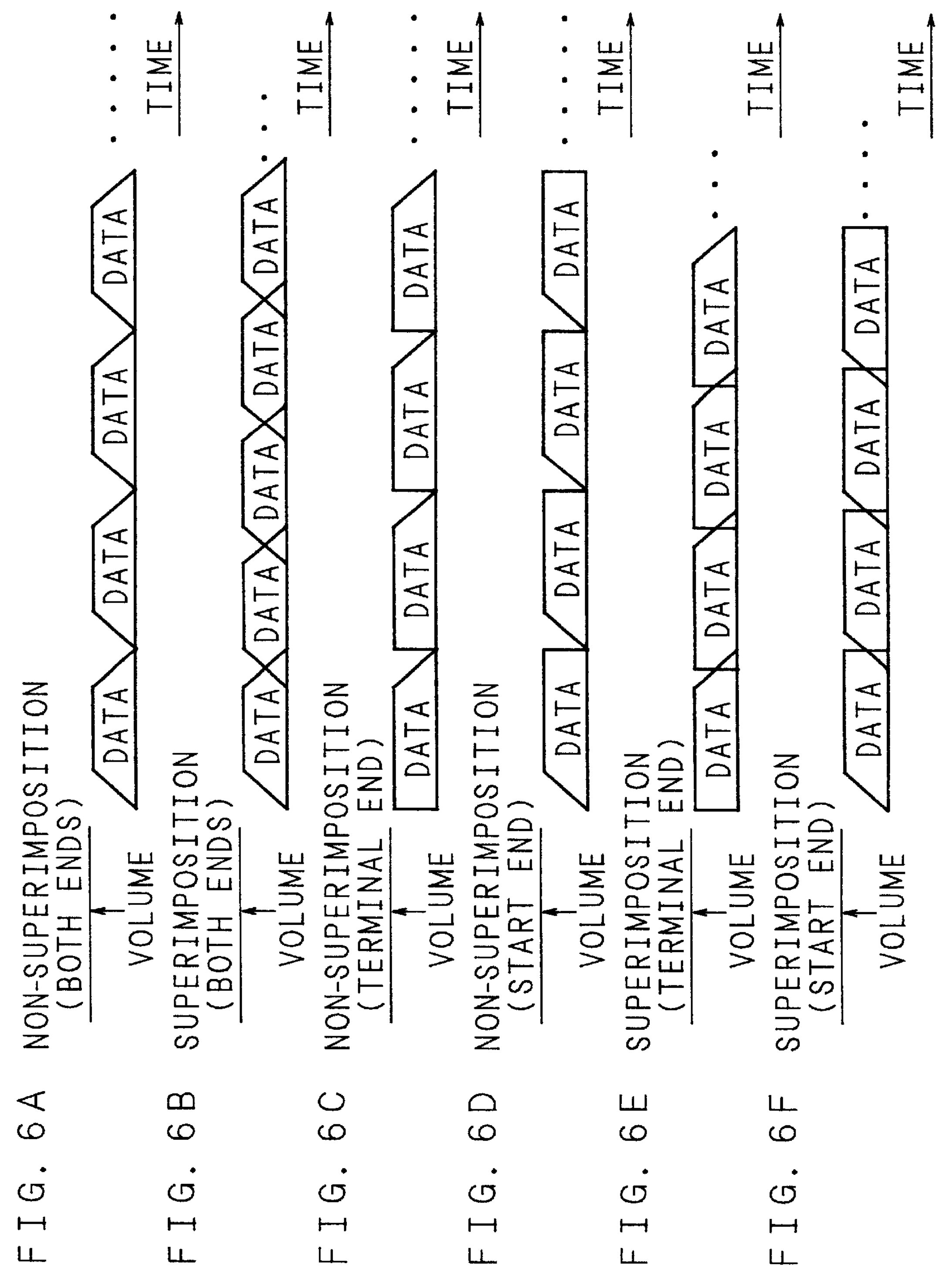
FIGS. 6A–6F are conceptual views showing the continued sound data reproduction condition.

FIGS. 6A–6F are conceptual views to show the reproduction conditions of the continued sound data to be outputted from the data output unit 2 through such a process. These figures show the six kinds of sound data patterns representing the different set conditions showing whether or not the fade-in process/fade-out process is performed, and whether or not the start end/terminal end superimposition is performed. FIG. 6A shows an example of performing fade-in process/fade-out process at the start end and the terminal end without superimposition, FIG. 6B shows an example of performing fade-in process/fade-out process at the start end and the terminal end with superimposition, FIG. 6C shows an example of performing fade-out process at the terminal end only without superimposition, FIG. 6D shows an example of performing fade-in process at the start end only without superimposition, FIG. 6E shows an example of performing fade-out process at the terminal end only with superimposition, and FIG. 6F shows an example of performing fade-in process at the start end only with superimposition, respectively. In any example, the joint of the adjacent sound data is smoothed, and noise can be reduced. In the example shown in FIG. 6A, the lengths of the fade-in process and fade-out process are equal to those of superimposition, and in the examples shown in FIGS. 6E and 6F, the length of the fade-out process or fade-in process is not equal to the length of superimposition.

Figure 7:
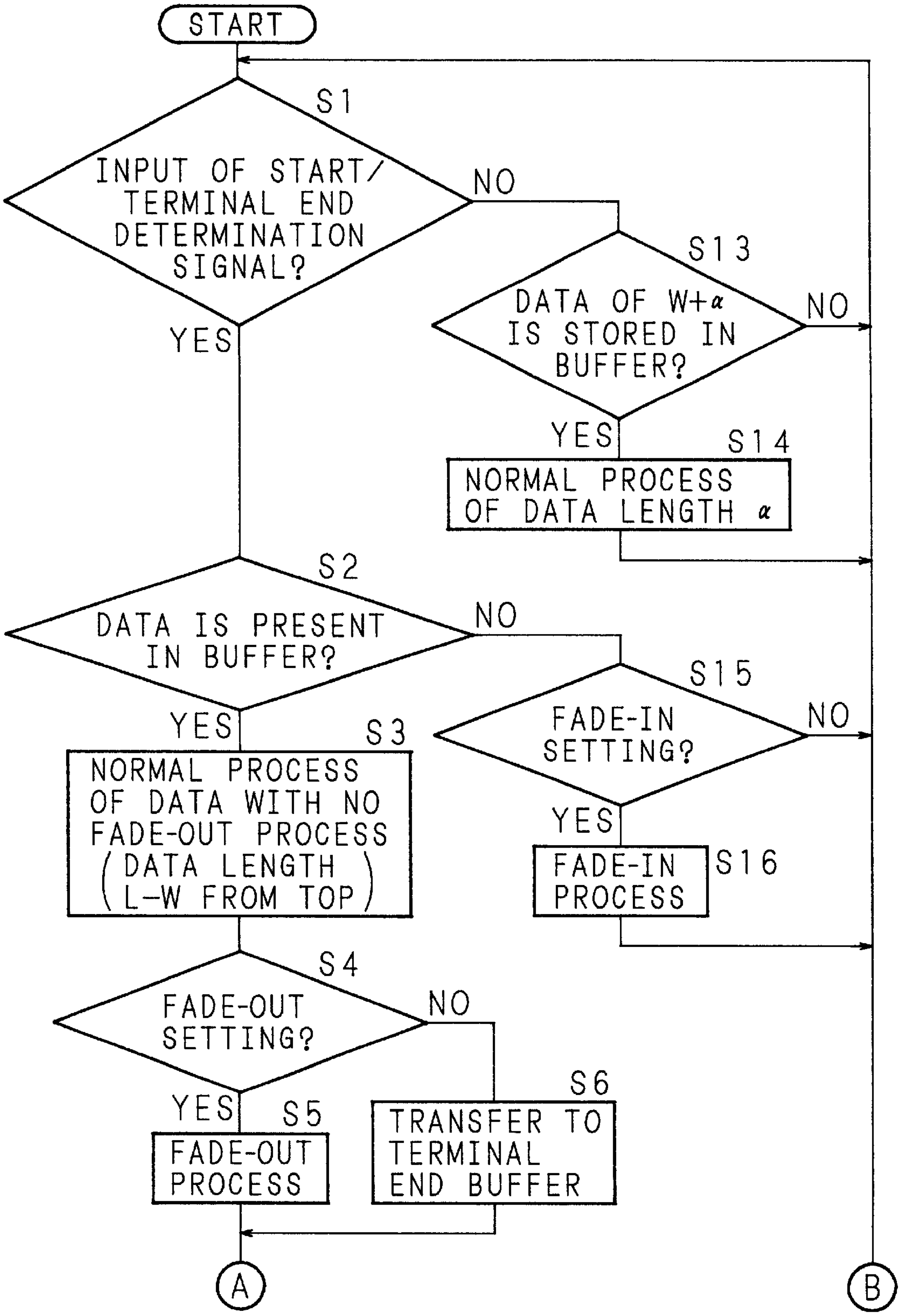
FIG. 7 is a flow chart showing the process procedure in the invention.
Figure 8:
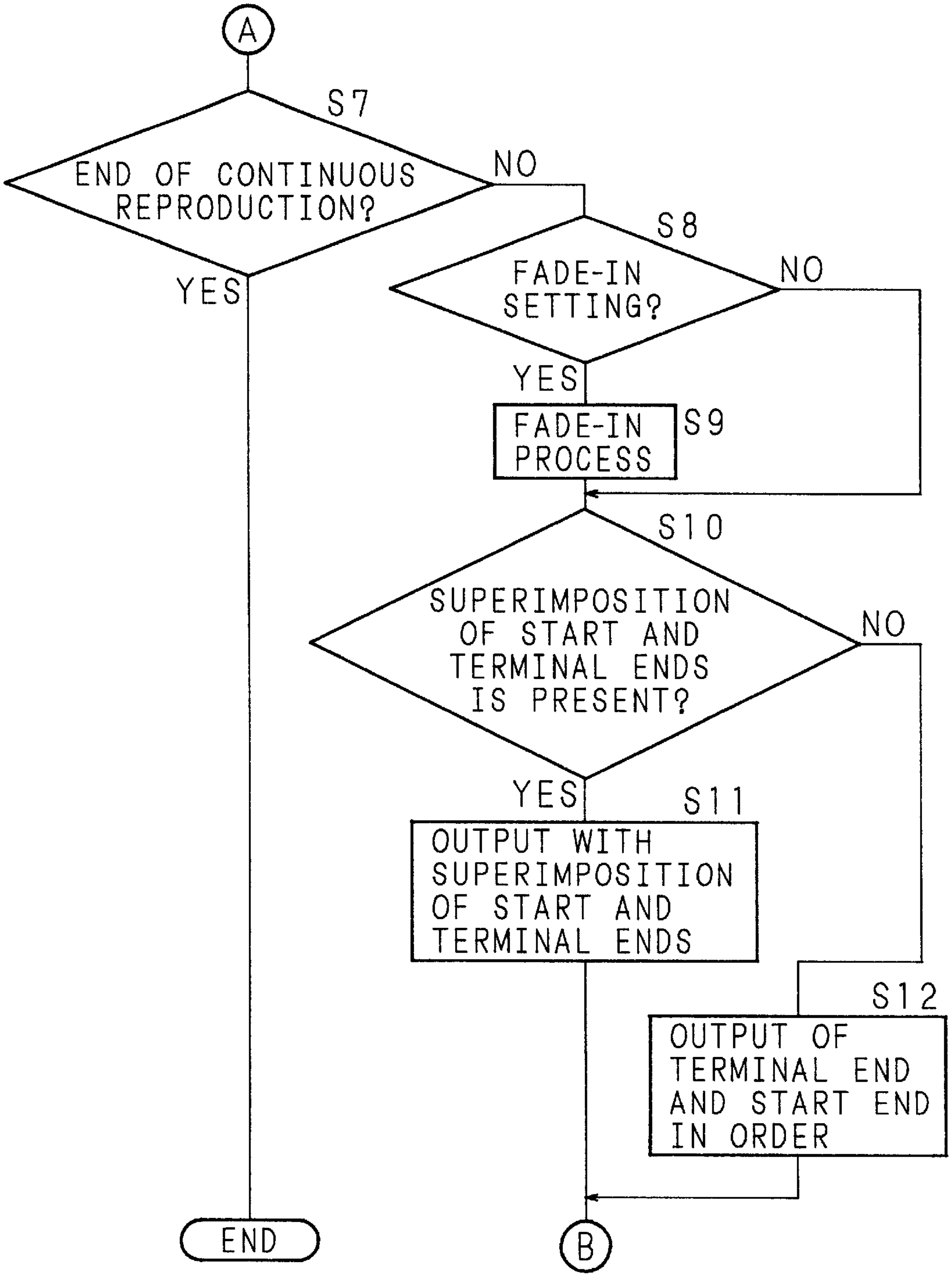
FIG. 8 is a flow chart showing the process procedure in the invention.

FIGS. 7 and 8 are the flow charts showing the process procedures in the reproduction unit 11. First, determination is made as to whether the start/terminal end determination signal has been received or not from the start/terminal end determination unit 4 (S1). If not received (S1: NO), determination is made as to whether the sound data of the fade-in/fade-out length (W)+α is retained in the buffer 22 or not (S13). If not retained (S13: NO), the process step is returned to S1, while if retained (S13: YES), the sound data having the data length of α is normally processed (S14) and the process step is returned to S1.

In the case where the start/terminal end determination signal is received (S1: YES), determination is made as to whether the sound data is retained in the buffer 22 or not (S2), In the case of no retention (S2: NO), it corresponds to the time of start of the continuous reproduction of sound data, wherein determination is made as to whether the setting is made to carry out fade-in process at the start end or not (S15). If no setting is made (S15: NO), the process procedure returns to S1, and if the setting is made (S15: YES), the step waits until the sound data for the fade-in width portion is retained and a fade-in process at the start end is performed (S16), and then the step returns to S1.

In the case where the sound data is retained in the buffer 22 (S2: YES), normal process is carried out on the sound data which is not subjected to fade-out process (S3), wherein the sound data not subjected to fade-out process denotes the sound data having the length of L–W from the top out of the sound data of the length L in the buffer 22 at the point of the input of the start/terminal end determination signal. Next, determination is given as to whether the setting is made to carry out a fade-out process at the terminal end or not (S4). When the setting is made (S4: YES), the terminal end fade-out processing is carried out (S5). When no setting is made (S4: NO), the sound data is transferred to the terminal end buffer 27 (S6).

Next, determination is made as to whether the continuous reproduction has ended or not (S7). If ended (S7: YES), the process procedure also is ended. If not ended (S7: NO), determination is made as to whether the setting is made to carry out a fade-in process at the start end or not (S8). If no setting is made (S8: NO), with the state unchanged, and if setting is made (S8: YES), after waiting until the sound data for the fade-in width portion has been retained and performing the fade-in process at the start end (S9), the process procedure advances to S10.

Determination is made as to whether the superimposition of the start end and the terminal end is set or not (S10). If set (S10: YES), the start end and the terminal end of the adjacent sound data are superimposed and sound data is outputted (S11), and the process returns to S1. On the other hand, in the case of no setting (S10: NO), the sound data is outputted in order of the terminal end of the preceding sound data and the start end-of the succeeding sound data (S12), and the process step returns to S1.

(Second embodiment)

Figure 9:
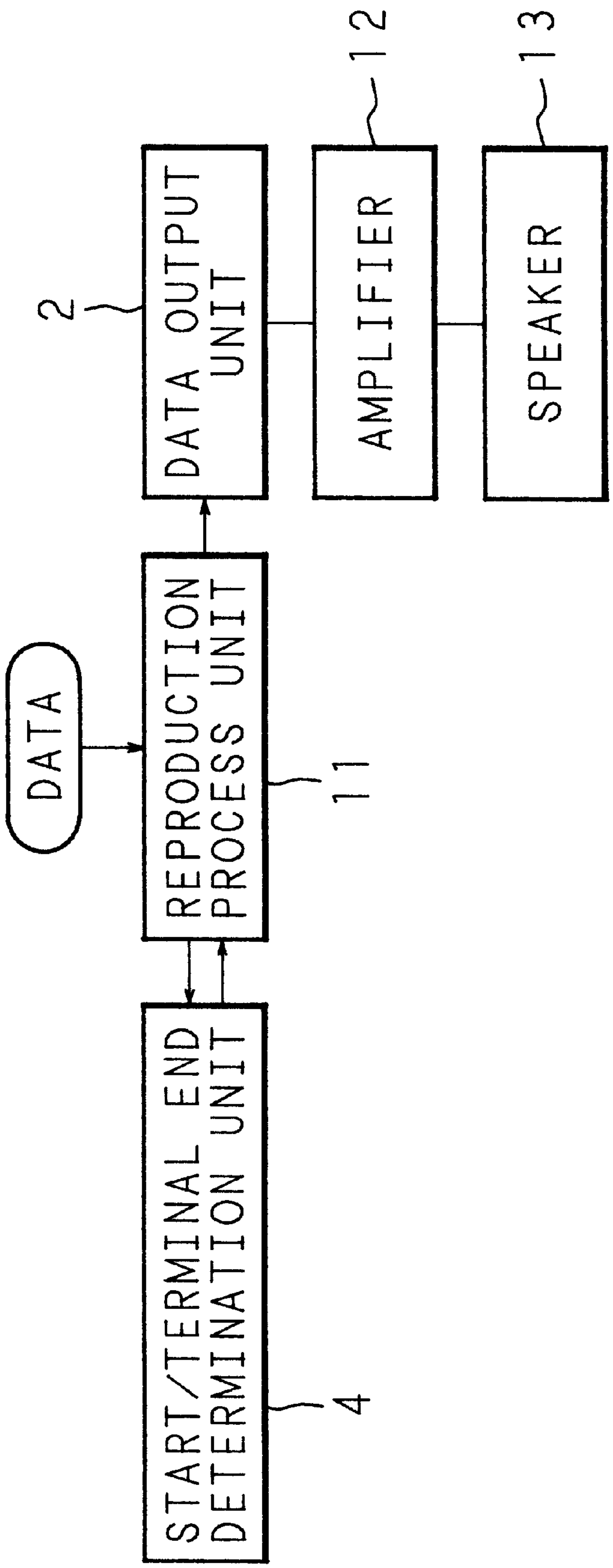
FIG. 9 is a block diagram showing the constitution of the second and third embodiments (sound reproduction apparatus)

FIG. 9 is a block diagram showing the constitution of the second embodiment (sound reproduction apparatus) of the invention. In FIG. 9, the parts indicated with the same numbers as those of FIG. 5 are the same parts as those of the first embodiment, and the internal constitutions of the reproduction process unit 11 are also the same as those of FIG. 5, so that their illustration is omitted. FIG. 9 shows a constitution to reproduce the continued sound data by carrying out the start end/terminal end determination process and fade-in process/fade-out process at the time of reproduction. To the data output unit 2, a speaker 13 as a reproduction unit is connected through an amplifier 12 for amplifying the sound data. In place of the speaker 13, headphones may be used. In the case where the amplitude of the sound data from the data output unit 2 is sufficient, the amplifier 12 is not necessarily provided.

(Third embodiment)

Explanation will be given about the third embodiment (sound reproduction apparatus) wherein, even if setting is made to carry out a fade-in process at the start end of each sound data, only the start end of the sound data at the top of the continued sound data does not fade in, and/or, even if setting is made to carry out a fade-out process at the terminal end of each sound data, only the terminal end of the sound data at the last part of the continued sound data does not fade out.

The constitution of the third embodiment is the same as that of the first embodiment or the second embodiment (FIG. 5 or FIG. 9). In the third embodiment, when the start end of the foremost sound data of the continued sound data is read into the data input unit 21, the sound data start signal identifiable from the start end/terminal end determination signal as described above, and when the terminal end of the last sound data of the continued sound data is read into the data input unit 21, the sound data termination signal identifiable from the start end/terminal end determination signal as described above, are respectively outputted from the start end/terminal end determination unit 4 to the process determination unit 24. When such sound data start signal or sound data termination signal is inputted, the process determination unit 24 sends a command signal to the data process unit 23 so as not to carry out fade-in process at the start end of the sound data and not to carry out fade-out process at the terminal end of the sound data.

Figure 10A:
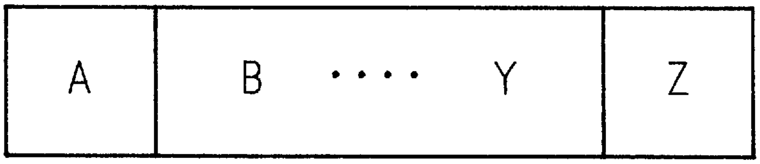
FIGS. 10A, 10B are conceptual views of one sound data out of the continued plural sound data
Figure 10B:
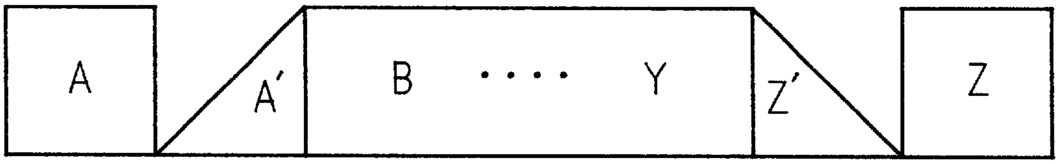

Taking an example of the case of repeatedly reproducing the same kind of sound data, concrete description will be given. FIGS. 10A and 10B are the views showing the patterns of the sound data thereof. FIG. 10A shows the original sound data not subjected to the fade-in process/fade-out process, and FIG. 10B shows the sound data with addition of the start end/terminal end which has been subjected to the fade-in process/fade-out process. In FIGS. 10A and 10B, A represents the start end to be subjected to fade-in process, and Z represents the terminal end to be subjected to fade-out process; A' represents the fade-in processed part, and Z' represents the fade-out processed part; and the remaining B–Y represent the parts to be normally processed. During the repeated reproduction in the third embodiment, first reproduction is made in order of A, B, . . . , Y, Z', and next the sequence of A', B, . . . , Y, Z' is repeated the predetermined times, and lastly reproduction is made in order of A', B, . . . , Y, Z.

FIGS. 11A–11F are conceptual views to show the reproduction condition of the continued sound data outputted from the data output unit 2 in the third embodiment described above. The respective set conditions showing whether or not the fade-in process/fade-out process has been performed and whether or not the start end/terminal end superimposition has been performed are same as those of FIGS. 4A–4F.

In the third embodiment, it is possible to reproduce the sound in which no such fade-in process/fade-out process is performed at the start and the last part of the continuous reproduction where the fade-in process/fade-out process is conspicuous. In the example described above, no fade-in process is carried out at the start end of the first sound data of the continued reproduction, and no fade-out process is carried out at the terminal end of the last sound data. However, it may be so arranged to carry out no fade-in process or fade-out process on either one side only, and the selection between them may be optionally set according to the characteristics of the sound data to be reproduced.

(Fourth embodiment)

Figure 12:
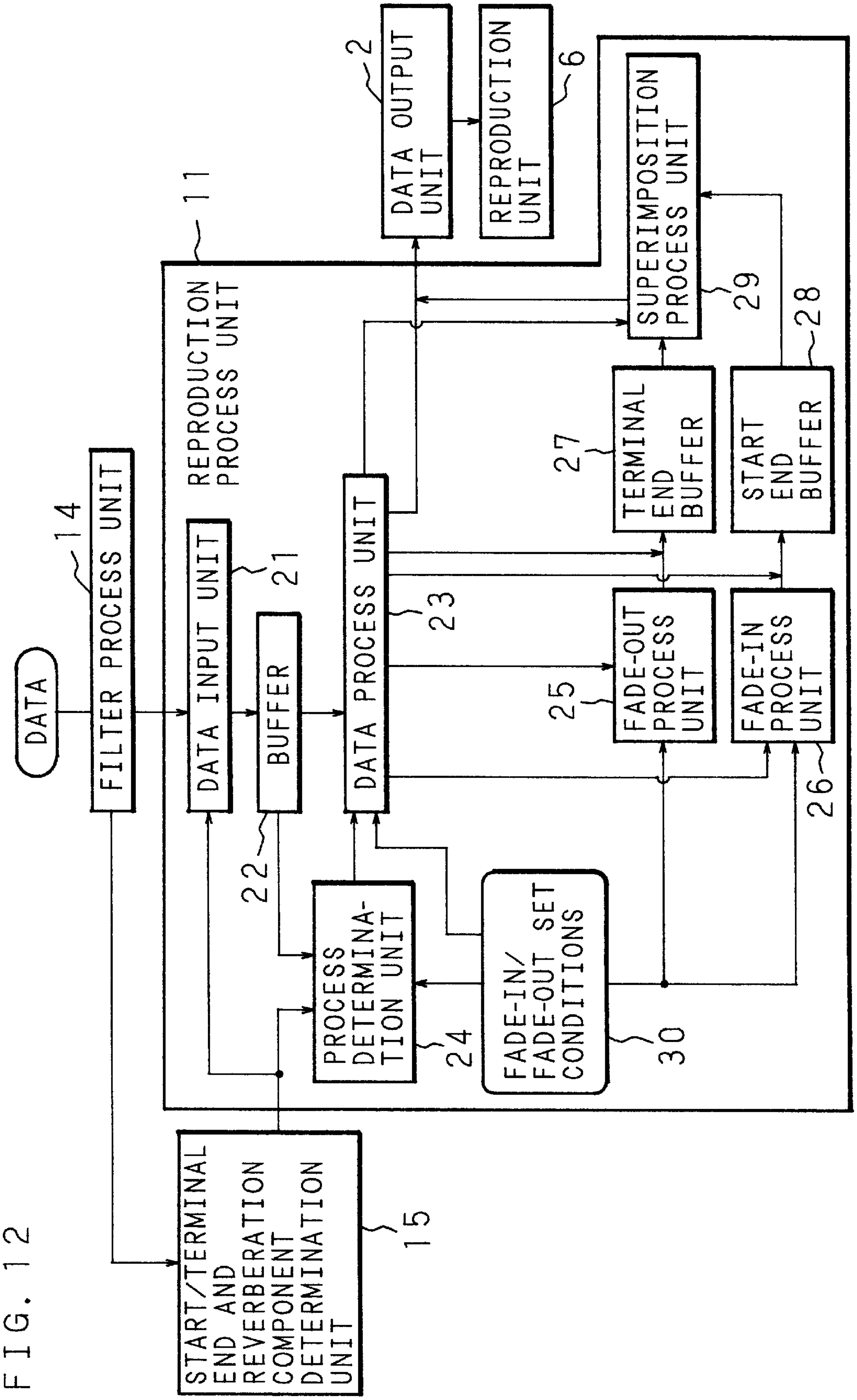
FIG. 12 is a block diagram showing the constitution of the fourth embodiment (sound reproduction apparatus)

FIG. 12 is a block diagram showing the constitution of the fourth embodiment (sound reproduction apparatus) of the invention. In FIG. 12, the reference numeral 14 is a filter process unit to carry out echo process, 3D sound process, etc. on the original sound data and add reverberation component to obtain a new sound data, and the reference numeral 15 is a start/terminal end and reverberation component determination unit for monitoring the new sound data in the filter process unit 14, determining the start end/terminal end of said sound data and reverberation component, and outputting the start/terminal end determination signal and reverberation component determination signal to the data input unit 21 in the reproduction process unit 11 and to the process determination unit 24. Other constitutions are the same as those of the first embodiment shown in FIG. 5, so that the same parts are indicated with the same numbers and their description is omitted.

Figure 13A:
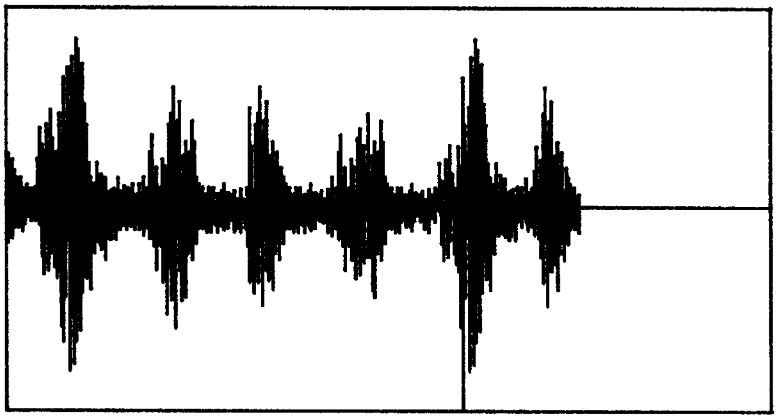
FIGS. 13A, 13B are actual measurement views of one sound data out of the continued plural sound data.
Figure 13B:
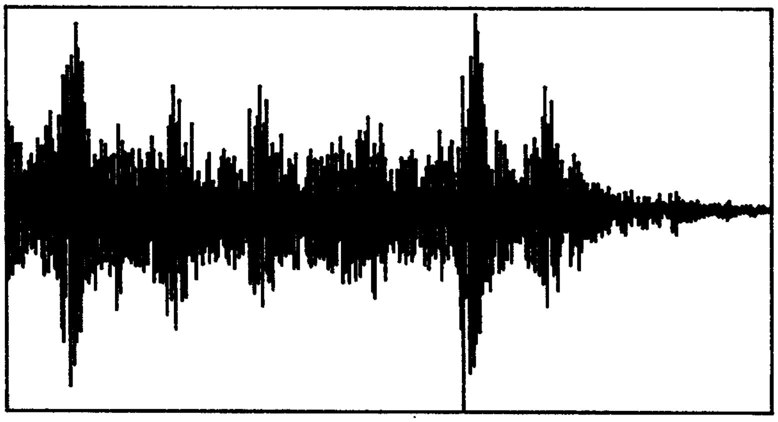
Figure 13C:
FIGS. 13C–13E are conceptual views of one sound data out of the continued plural sound data.
Figure 13D:
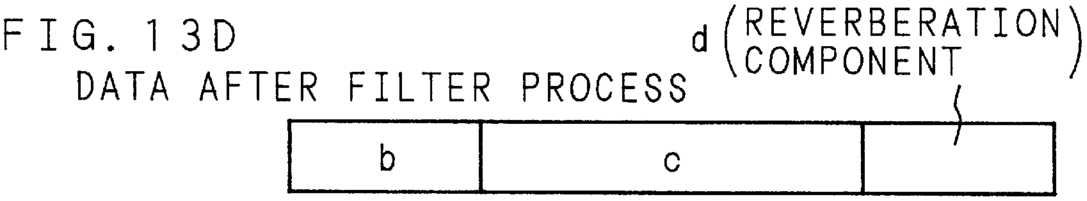
Figure 13E:
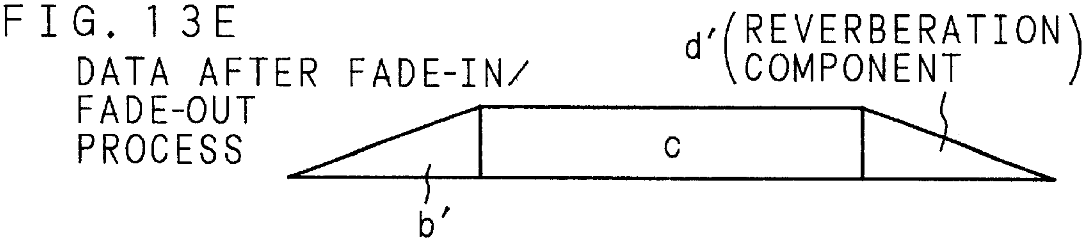

Next, the operation is explained. FIGS. 13A–13E are the actual measurement views and conceptual views of one sound data out of the continued plural sound data, wherein FIGS. 13A and 13C are respectively the actual measurement view and conceptual view of the original sound data, FIGS. 13B and 13D are respectively the actual measurement view and conceptual view of the new sound data after carrying out the filter process on the original sound data, and FIG. 13E shows a conceptual view of the sound data after carrying out fade-in process/fade-out process on said new sound data. By carrying out a filter process on the original sound data, a new sound data comprising a start end part b, a center part c, and a reverberation component d are obtainable. And, the start end part b is subjected to fade-in process to become b', and the reverberation component d is subjected to fade-out process to become d'.

Figure 14:
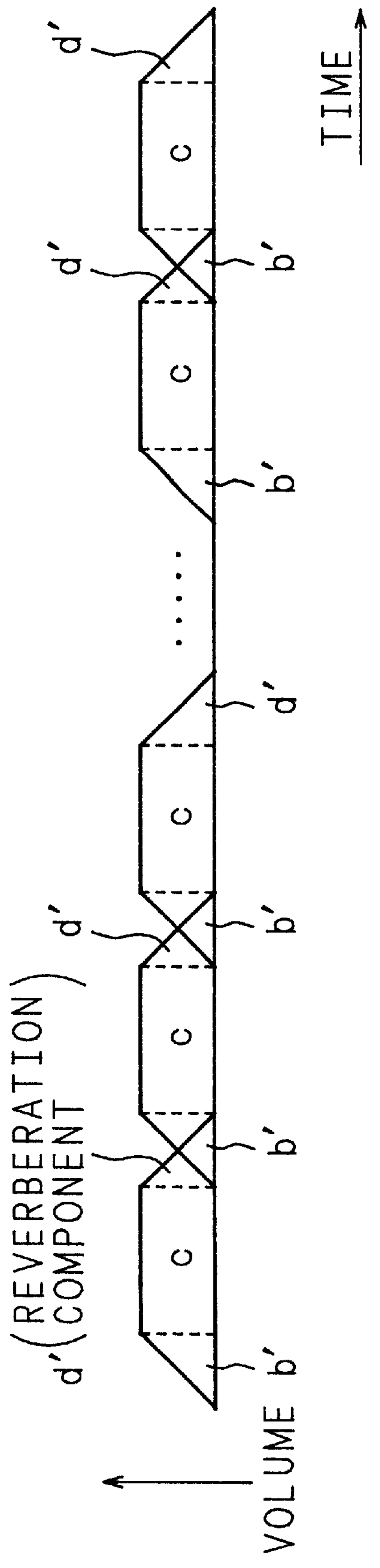
FIG. 14 is a conceptual view showing the continued sound data reproduction condition.

In the filter process unit 14, the inputted original sound data (FIGS, 13A, 13C) are subjected to processes such as echo, 3D sound, and the like, and the new sound data after processing (FIGS. 13B, 13D) are read into the data input unit 21. And, the read sound data are temporarily retained in the buffer 22. And, based on the information from the start/terminal end and reverberation component determination unit 15, the start end having the same time length portion as the reverberation component of the sound data (FIG. 13D-*b*) is subjected to a fade-in process in the fade-in process unit 26, and the sound data after processing (FIG. 13E-*b*') is retained in the start end buffer 28. The sound data part before becoming the reverberation component following it (FIG. 13D-*c*) is transferred as it is to the data output unit 2. The reverberation component of the sound data (FIG. 13D-*d*) is subjected to fade-out process in the fade-out process unit 25, and the reverberation component after processing (FIG. 13E-*d*') is retained in the terminal end buffer 27. And, between the adjacent sound data, the fade-out processed reverberation component of the preceding sound data and the fade-in processed start end of the succeeding sound data are superimposed in the superimposition process unit 29, and the sound data after superimposition is transferred to the data output unit 2. Since the processing as above can be performed in accordance with the foregoing first embodiment, detailed explanation is omitted. FIG. 14 is a conceptual view of the reproduction condition of the continued sound data in the fourth embodiment.

In the fourth embodiment, by carrying out such a process, there is no loss of effects such as echo, 3D sound, etc. at the joint between the adjacent sound data, and no generation of noise. Furthermore, as the length of the sound data after the fade-in process/fade-out process becomes equal to the length of the original sound data, the time control in the continuous reproduction is facilitated.

(Fifth embodiment)

Figure 15:
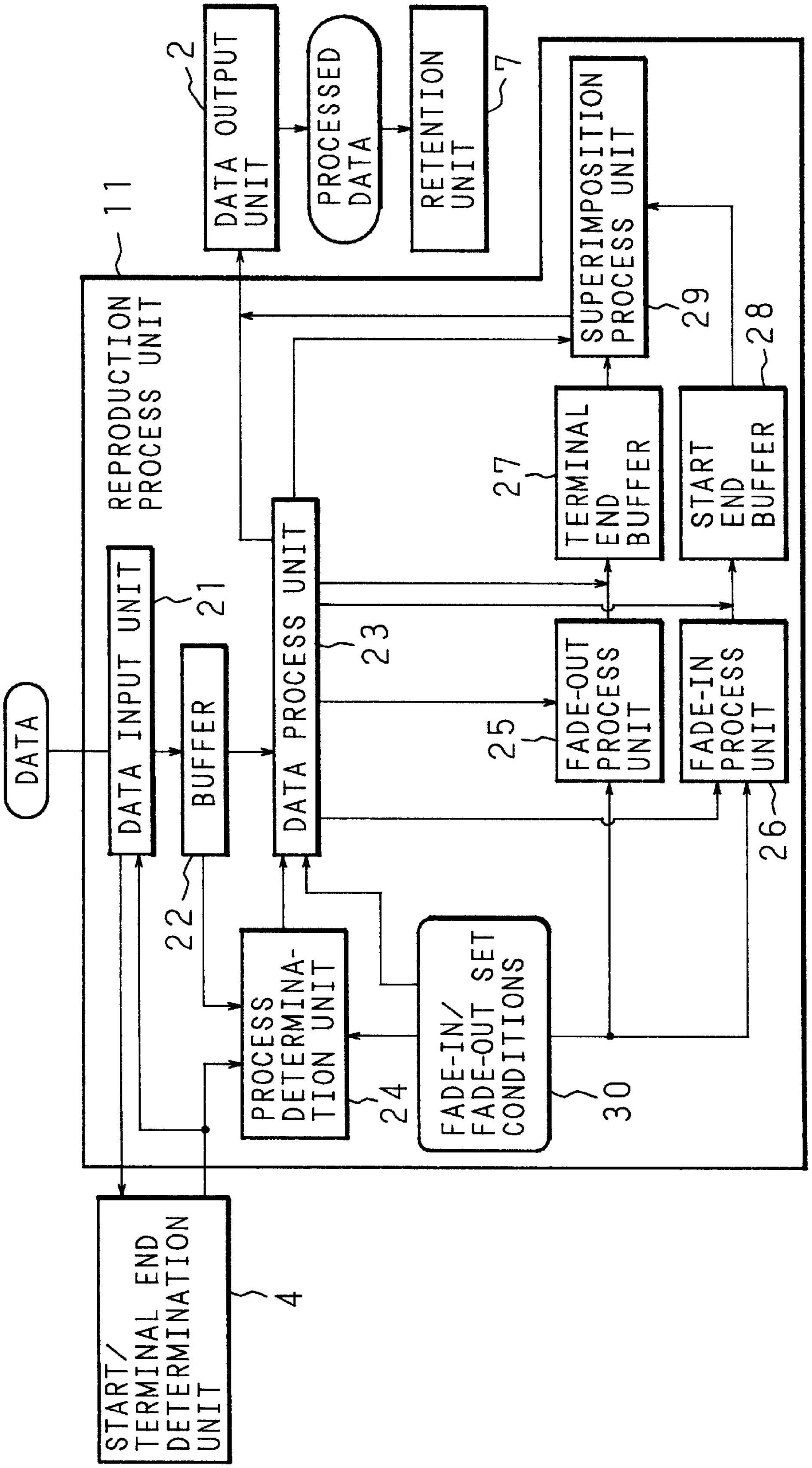
FIG. 15 is a block diagram showing the constitution of the fifth and sixth embodiments (sound data creation apparatus)

FIG. 15 is a block diagram showing the constitution of the fifth embodiment (sound data creation apparatus) of the invention. In FIG. 15, the parts indicated with the same numbers as in FIG. 5 are the same parts as those of the first embodiment. In FIG. 15, the reference numeral 7 is a retention unit for storing the sound data outputted from the data output unit 2. The processed data having continuation of the sound data whose start end and/or the terminal end are subjected to fade-in process and/or fade-out process can be retained in the retention unit 7.

Next, the operation is explained. Since the steps of process from the reading process of the sound data to the data input unit 21 to the sound data transfer process to the data output unit are the same as those of the first embodiment above, the explanation thereon is omitted. The processed sound data outputted from the data output unit 2 is retained in the retention unit 7. And, the processed sound data can be read at an optional time later for use in reproduction.

In this manner, in the fifth embodiment, the sound data subjected to fade-in process and/or fade-out process at the start end and/or the terminal end is retained. Accordingly, in reproducing the continued sound data in the same pattern, the processed sound data which has been created is used to eliminate the necessity to repeat the fade-in process/fade-out process any more, and the process amount in reproduction can be curtailed. Moreover, once the sound data after the fade-in process/fade-out process is created, no noise should be generated at the joint of the sound data even when the conventional reproduction apparatus is used.

(Sixth embodiment)

Here explained is the sixth embodiment for creating the processed sound data (sound data creation apparatus) wherein, even if setting is made to carry out a fade-in process at the start end of each sound data, no fade-in process is carried out at least at the start end of the foremost sound data in the continued sound data and/or even if setting is made to carry out a fade-out process at the terminal end of each sound data, no fade-out process is carried out at least at the terminal end of the last sound data in the continued sound data.

The constitution of the sixth embodiment is the same as that of the fifth embodiment (FIG. 15). Also, the sixth embodiment is an example of retaining in the retention unit 7 the processed sound data subjected to the fade-in process/fade-out process as explained in the third embodiment. Accordingly, this embodiment produces the same effect as that of the fifth embodiment, as well as the effect of the third embodiment.

(Seventh embodiment)

Figure 16:
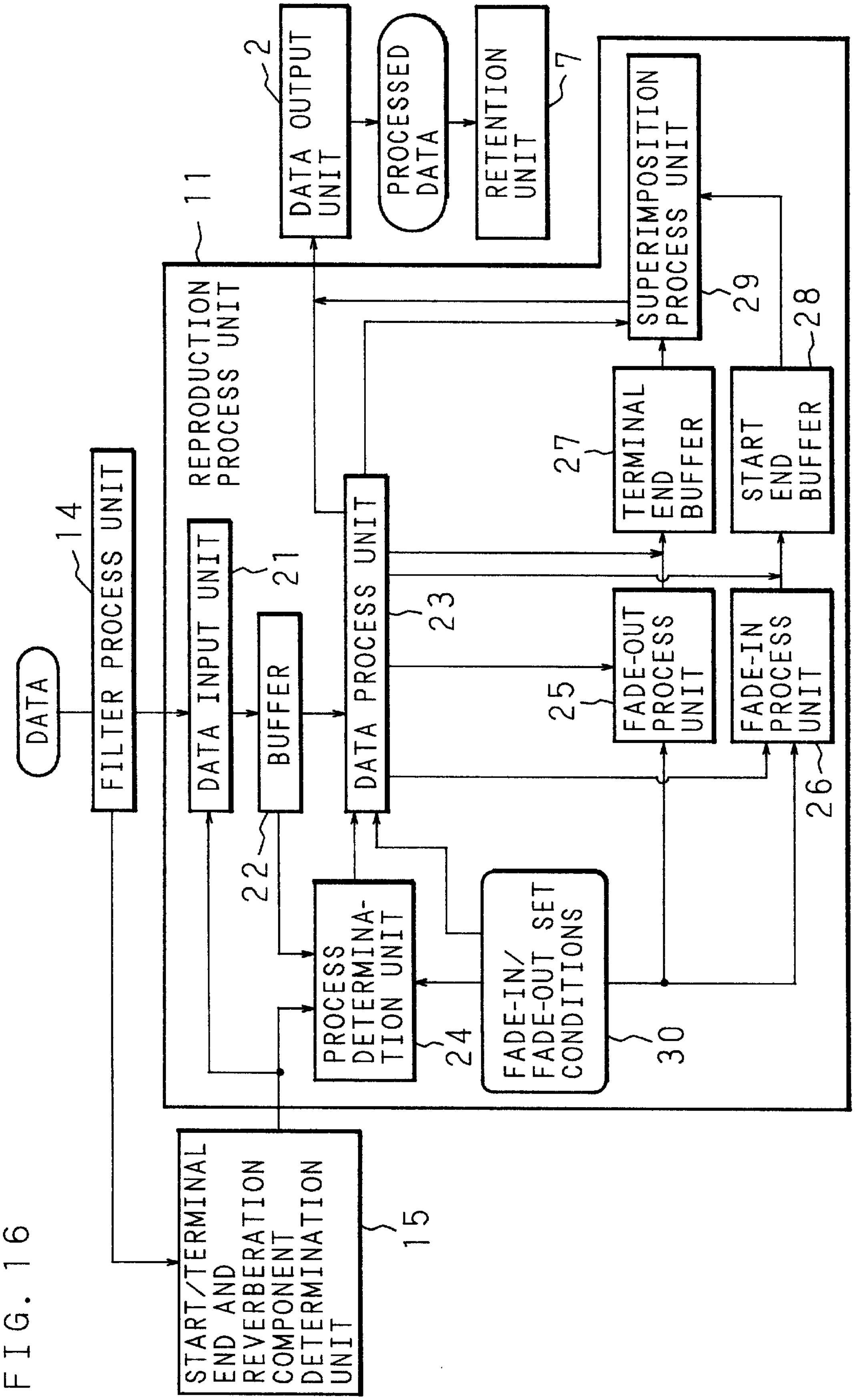
FIG. 16 is a block diagram showing the constitution of the seventh embodiment (sound data creation apparatus).

FIG. 16 is a block diagram showing the constitution of the seventh embodiment (sound data creation apparatus) of the invention. In FIG. 16, the part indicated with the same number as in FIG. 12 is the same part as that of the fourth embodiment, and the reference numeral 7 is a retention unit similar to that of FIG. 15.

The seventh embodiment is an example such that the filter processed sound data subjected to the fade-in process/fade-out process is to be retained in the retention unit 7, as explained in the fourth embodiment above. Accordingly, this embodiment produces the same effect as the fifth embodiment, and also has the effect of the fourth embodiment.

Now, each of the embodiments as described above can be applied to any of the cases where the same kind of sound data continues, namely, the case where the same sound data is repeatedly reproduced, and the case where the different kinds of sound data are continued.

Although, in the embodiments illustrated above, illustration is made to use the form of a half triangular window in the conceptual view of the sound data subjected to fade-in process/fade-out process, it is an exemplification. Needless to say, any other shape fade-in process/fade-out process such as Hanning window, Hamming window, etc. may be provided.

As described above, according to the sound reproduction apparatus of the invention, fade-in process and/or fade-out process is carried out at the start end and/or the terminal end of the continued sound data. Accordingly, generation of noise at the joint of the adjacent sound data can be prevented, and no unpleasant feeling is given to the listeners.

According to the sound data creation apparatus of the invention, the processed sound data subjected to fade-in process and/or fade-out process at the start end and/or the terminal end of the continued respective sound data is created and retained. Accordingly, using the processed sound data, the sound having no noise at the joint of the adjacent sound data can be offered to the listeners for repeated times.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A sound reproduction apparatus for reproducing sound corresponding to continued plural sound data, comprising:

reproduction means for reproducing inputted sound data into sound;

means for carrying out acoustic processing on respective ones of the continued plural sound data to generate reverberation components therefor;

determination means for determining a start end of each sound data after acoustic processing and a position of the respective reverberation component;

means for carrying out fade-in processing at the start end of each sound data after acoustic processing by a same length as a length of the respective reverberation component;

means for carrying out fade-out processing on the reverberation components;

superimposition means for superimposing the start end of a sound data subjected to fade-in processing and the reverberation component subjected to fade-out processing of an adjacent sound data; and output means for outputting the plural sound data after superimposition continuously to said reproduction means.

2. A sound data creation method comprising:

carrying out acoustic processing on original plural sound data to generate respective reverberation components therefor;

carrying out fade-in processing at a start end of each sound data after acoustic processing by a same length as a length of the respective reverberation component;

carrying out fade-out processing on the reverberation components;

continuously outputting a plurality of sound data in a mode in which the start end of a sound data subjected to fade-in processing and the reverberation component subjected to fade-out processing of an adjacent sound data are superimposed; and retaining the outputted plural sound data as the plural sound data for carrying out continuous reproduction.

3. A sound data creation apparatus for creating a plurality of sound data for continuous reproduction based on original continued plural sound data, comprising:

means for carrying out acoustic processing on the original continued plural sound data to generate respective reverberation components therefor;

determination means for determining a start end of each sound data after acoustic processing and a position of the respective reverberation component;

means for carrying out fade-in processing at the start end of each sound data after acoustic processing by a same length as a length of the respective reverberation component;

means for carrying out fade-out processing on the reverberation components;

superimposition means for superimposing the start end of a sound data subjected to fade-in processing and the reverberation component subjected to fade-out processing of an adjacent sound data;

output means for continuously outputting the plural sound data after superimposition; and means for retaining the outputted plural sound data as the plural sound data for carrying out continuous reproduction.

* * * * *